United States Patent
Ohkouchi et al.

(10) Patent No.: US 6,563,560 B2
(45) Date of Patent: May 13, 2003

(54) APPARATUS AND METHOD OF PRODUCING ALIGNMENT LAYER FOR LIQUID CRYSTAL DISPLAY

(75) Inventors: Nozomu Ohkouchi, Yokosuka (JP); Masanobu Shigeta, Yokosuka (JP); Tatsushi Nakanishi, Zushi (JP); Takashi Moroboshi, Yokohama (JP); Takeshi Hosoya, Yokohama (JP); Masami Sonda, Yokohama (JP); Nobuyasu Katayama, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 10/116,033

(22) Filed: Apr. 5, 2002

(65) Prior Publication Data

US 2002/0145692 A1 Oct. 10, 2002

(30) Foreign Application Priority Data

| Apr. 6, 2001 | (JP) | ................................. 2001-108237 |
| Oct. 25, 2001 | (JP) | ................................. 2001-327438 |
| Oct. 30, 2001 | (JP) | ................................. 2001-332300 |

(51) Int. Cl.$^7$ .............................. G02F 1/13; B05D 5/06
(52) U.S. Cl. ...................................... 349/125; 427/162
(58) Field of Search ......................... 349/123, 125, 349/187; 428/1.23; 427/162

(56) References Cited

U.S. PATENT DOCUMENTS

| 4,705,359 A | * | 11/1987 | Amstutz et al. ............. 349/125 |
| 4,897,290 A | * | 1/1990 | Terasaka et al. ............. 427/162 |
| 5,620,755 A | | 4/1997 | Smith, Jr. et al. ............... 428/1 |

FOREIGN PATENT DOCUMENTS

| JP | 5-257146 | 10/1993 |
| JP | 6-186563 | 7/1994 |
| JP | 7-159788 | 6/1995 |

OTHER PUBLICATIONS

Lu et al., SID '00 Digest, pp. 446–449, Homeotropic Alignment by Single Oblique Evaporation of SiO$_2$ and Its Application to . . .

Urbach et al., Applied Physics Ltrs., vol. 25, No. 9, pp. 479–481, Nov. 1, 1974, Alignment of nematics and smectics on . . .

\* cited by examiner

Primary Examiner—Toan Ton
(74) Attorney, Agent, or Firm—Jacobson Holman PLLC

(57) ABSTRACT

An alignment layer to be used for liquid crystal displays each having at least two substrates with liquid crystals sealed therebetween is formed as follows: The substrates placed on each of several substrate trays are heated in a first load-lock chamber. At least one of the two substrates is irradiated with evaporated particles of oxide silicon (SiOx: $1.0 \leq x \leq 2.0$) by vacuum deposition at an angle in the range from 45° to 60° from a direction of the normal line on the substrate surface to form an alignment layer thereon while the substrate trays are being moved in a layer-deposition chamber intermittently or sequentially. The substrate trays are cooled in a second load-lock chamber, thus producing substrates each formed the alignment layer thereon. The deposition chamber may be set under a requirement $0 \leq \Delta\theta \leq 3°$ in $\Delta\theta = \tan^{-1}(d \cos\theta/(D+d \sin\theta))$, "d" a distance from the substrate center to the center of a substrate edge, "D" a distance from the substrate center to the center of an evaporation source containing the oxide silicon, and $\theta$ an angle formed between a direction in which the normal line extends on the substrate center and another direction in which evaporated particles of oxide silicon are deposited on the substrate center from the evaporation source. The alignment layer may be formed at an angle of layer deposition in the range from 3° to 10°.

5 Claims, 13 Drawing Sheets

| EVAPORATION ANGLE ($\theta$) | EVALUATION OF IMAGE QUALITY |
|---|---|
| 40° OR SMALLER | DISCLINATIONS AND ALIGNMENT PROBLEM |
| 40° — 45° | MANY DISCLINATIONS |
| 45° — 50° | DICREASE IN DISCLINATION FAVOURABLE CONTRAST RATIO |
| 50° — 55° | NO DISCLINATIONS STABLE CONTRAST RATIO FOR PRODUCTION |
| 55° — 60° | VARIATIONS BEGIN IN CONTRAST RATIO |
| 60° — 65° | VARIATIONS IN CONTRAST RATIO |
| 65° OR LARGER | WIDE VARIATIONS IN CONTRAST RATIO, NO REPRODUCIBILITY |

FIG.10

APPARATUS AND METHOD OF PRODUCING ALIGNMENT LAYER FOR LIQUID CRYSTAL DISPLAY

BACKGROUND OF THE INVENTION

The present invention relates to liquid crystal displays used as a major component of projectors, projection TVs, etc. Particularly, this invention relates to an apparatus and a method of producing alignment layers to be used for liquid crystal displays and a liquid crystal display having alignment layers produced by the alignment-layer producing apparatus and method.

Active-matrix liquid crystal displays having TFTs, liquid crystal displays having a silicon wafer-to-glass plate stuck structure, etc., have been widely used for visual equipment such as projectors, projection TVs and head-mount displays, with increased production.

A known liquid crystal display 10 is shown in FIGS. 1 and 2. A glass substrate 2 is covered with a transparent conductive layer 1. Another glass substrate or a silicon IC substrate 4 has pixel electrodes (a displaying area) 3 thereon. A pair of alignment layers 5a and 5b are formed on the transparent conductive layer 1 and the glass substrate 4, respectively.

The glass substrates 2 and 4 are arranged as facing each other with a gap (cell gap). The cell gap is filled with a liquid crystal 6 through a fill-hole 9. The glass substrates 3 and 4 are then stuck each other via the liquid crystal 6 with a sealant adhesive 7 through the fill-hole 9 which will be sealed later. The sealant adhesive 7 is a mixture of spacers $7_1$ and an adhesive (not shown) which define the cell gap. The glass substrate 2 is covered with an anti-reflective layer 8.

The alignment layers 5a and 5b are formed, for example, with a parallel alignment procedure in which an organic polymer such as polyimide is subjected to coating, for example, spin coating or offset printing, followed by baking and rubbing.

The parallel alignment procedure, however, has a lot of steps from polyimide printing to cleaning after rubbing. Moreover, rubbing could generate dust. It is further difficult through this procedure to attain high alignment properties (pretilt angle controllability) required for a desired displaying characteristics.

Application of the known liquid crystal display 10 to projectors and projection TVs requires high contrast ratio.

Another method of forming the alignment layers 5a and 5b for high contrast ratio is, for example, an oblique evaporation procedure with electron-beam deposition to form a metallic oxide layer of oxide silicon (SiO or $SiO_2$) on the substrate from an oblique direction. This method requires no rubbing procedures and achieves high alignment properties and also high contrast ratio especially in vertical alignment system.

The oblique perpendicular alignment procedure is explained in detail with reference to FIG. 3.

Shown in FIG. 3 is an electron-beam deposition apparatus 20 equipped with an electron-gun unit U having a crucible 11 and an electron gun 19 with a filament 18. Oxide silicon 12 is contained in the crucible 11, as an evaporation source. The oxide silicon 12 is irradiated with electron beams 21 from the electron gun 19, as indicated by an arrow, so that it is heated and evaporated from the crucible 11. The evaporated particles of the oxide silicon 12 are dispersed upwards and obliquely deposited on the glass substrate 2 at an evaporation angle θ from the direction of normal line on the substrate surface, thus forming an alignment layer of the oxide silicon 12 thereon. The crucible 11 is usually opened in a (vertical) direction 17 of the normal line on a base 16 of the apparatus 20. This direction of crucible's opening is called the direction of the electron-gun unit U in the following disclosure.

This oblique evaporation utilizes anisotropic properties of the oxide silicon 12. Deposition (layer deposition) on the glass substrate 2 from an oblique direction provides an oblique thin layer with obliquely aligned long bar-like liquid-crystal molecules.

FIG. 4 illustrates oxide silicon 14a to 14n obliquely deposited on the glass substrate 2 and liquid-crystal molecules 15a to 15n aligned over the oxide silicon 14a to 14n. An angle α is a pretilt angle, and an angle γ is an angle of layer deposition for the oxide-silicon alignment layer as disclosed later.

These methods are disclosed, for example, in Japanese Unexamined Patent Publication Nos. 5-257146, 6-186563 and 7-159788.

The electron-beam deposition for forming an alignment layer with the oxide silicon 12 as explained above has to meet crucial requirements for an oblique evaporation angle θ. It is, however, difficult to meet such crucial requirements and causes problems when several liquid crystal displays 10 shown in FIGS. 1 and 2 are formed on a large-size glass substrate 2.

The location of the glass substrate 2 in the electron-beam deposition apparatus 20 shown in FIG. 3 varies as the size of the substrate 2 varies as illustrated in FIG. 5. The oblique evaporation angle θ also varies such as θa and θb in FIG. 5 as the location of the glass substrate 2 varies. This causes variation in angle of layer deposition γ for the oxide silicon 14a to 14n shown in FIG. 4, thus alignment of liquid crystals is not uniform. This results in variation in image quality for the liquid crystal display 10. In illustration of change in deposition angle θ in FIG. 5, "d" is the distance from the center of the glass substrate 2 formed by oblique deposition to the substrate edge.

Moreover, twist angles Δψ are generated as shown in FIG. 6 when the glass substrate 2 is formed as being large in the direction perpendicular to the direction in which thin layer-structure of the oxide silicon 14a to 14n grows, or as being large in the direction perpendicular to the planer direction of the substrate 2 for higher productivity as discussed above. The twist angles Δψ also depend on the location of the glass substrate 2 in the electron-beam deposition apparatus 20, as shown in FIG. 3. These angles also cause variation in image quality for the liquid crystal display 10.

One solution to these problems requires a small glass substrate 2 or a big deposition chamber 13 (FIG. 3) in the electron-beam deposition apparatus 20 to have an enough distance (deposition distance) D from the evaporation source 12 to the glass substrate 2.

However, the smaller the glass substrate 2, the more it is difficult to install the substrate 2 in the deposition chamber 13 and adopt an automatic substrate-installation mechanism.

Therefore, such solution has to employ a batch system in which small glass substrates 2 are processed. This system, however, causes generation of dust from the substrates while they are being processed, which results in low yielding and also low image quality.

Moreover, such a batch system takes time for sequential procedures of heating the glass substrates 2, reaching a target vacuum, forming layers on each substrate, cooling the substrates and vacuum bending. The total production process time thus depends on these procedures.

Furthermore, the bigger the deposition chamber 13, the more expensive the price of the electron-beam deposition apparatus 20, and also the larger the volume of the chamber, thus causing longer vacuum-reaching time, heating time, etc., for low productivity.

A long deposition distance D in the deposition chamber 13 could be attained with an evaporation-angle direction component of evaporated particles of the oxide silicon 12 to the glass substrate 2 which is obtained by shifting the electron-gun unit U in the direction horizontal to the base 16 of the electron-beam deposition apparatus 20, which is disclosed in, for example, Japanese Unexamined Patent Publication 6-186563.

This method, however, causes variation in evaporation rate for the oxide silicon 12 in the direction of evaporation, or lower evaporation rate as the electron-beam gun unit is shifted more and more, which thus results in low production.

The electron-beam deposition explained above for forming alignment layers with the oxide silicon 12 requires a precise pretilt-angle control for higher contrast ratio.

However, optimum values for such a precise pretilt-angle control must be found for several factors, such as, oblique evaporation angle $\theta$, vacuum in the deposition chamber, substrate temperature, and thickness in alignment layer. These optimum values are necessary for the fact that the properties of oxide silicon layers have not known exactly, which nevertheless directly affect the pretilt-angle control. In production of liquid crystal displays, the best production requirements for alignment-layer deposition should be decided in accordance with evaluation of sample liquid crystal displays on pretilt-angles or image quality. The evaluation of sample liquid crystal displays, however, takes a lot of days.

SUMMARY OF THE INVENTION

A purpose of the present invention is to provide an apparatus and a method of producing alignment layers to be used for liquid crystal displays, for which large glass substrates can be adopted, for high image quality and productivity.

Another purpose of the present invention is to provide a liquid crystal display having alignment layers produced by the alignment-layer producing apparatus and method.

The present invention provides a method of forming an alignment layer to be used for liquid crystal displays each having at least two substrates with liquid crystals sealed therebetween, the method comprising the steps of: heating the substrates placed on each of several substrate trays in a first load-lock chamber; irradiating at least one of the two substrates with evaporated film of oxide silicon (SiOx: $1.0 \leq x \leq 2.0$) by vacuum deposition at an angle in the range from 45° to 60° from a direction of a normal line on the substrate surface to form an alignment layer thereon while the substrate trays are being moved in a deposition chamber intermittently or sequentially; and cooling the substrate trays in a second load-lock chamber, thus producing substrates each formed the alignment layer thereon.

Moreover, the present invention provides an apparatus for forming an alignment layer to be used for liquid crystal displays each having at least two substrates with liquid crystals sealed therebetween, the apparatus comprising a deposition chamber for depositing an alignment layer of oxide silicon (SiOx: $1.0 \times 2.0$) on at least one of the two substrates under a requirement $0 \leq \Delta\theta \leq 3°$ in $\Delta\theta = \tan^{-1}(d\cos\theta/(D+d\sin\theta))$ in which "d" is a distance from the substrate center to the center of a substrate edge required for alignment-layer deposition and "D" is a distance from the substrate center to the center of an evaporation source containing the oxide silicon for alignment-layer deposition, and $\theta$ is an angle formed between a direction in which a normal line extends on the substrate center and another direction in which evaporated particles of oxide silicon are deposited on the substrate center from the evaporation source.

Furthermore, the present invention provides a reflective liquid crystal display having liquid crystals sealed between a transparent substrate and a silicon substrate, and an alignment layer of oxide silicon (SiOx: $1.0 \leq x \leq 2.0$) formed on at least one of the substrates at an angle of layer deposition in the range from 3° to 10° for alignment of the liquid crystals.

BRIEF DESCRIPTION OF DRAWINGS

FIG. 10 is a view showing relations between evaporation angles and image quality for liquid crystal displays;

DETAILED DESCRIPTION OF PREFERRED EMBODIMENTS

Preferred embodiments according to the present invention will be disclosed with reference to the attached drawings.

Elements in the embodiments which will be disclosed below, that are the same as or analogous to the elements shown in FIGS. 1 to 6 are referenced by the same reference numbers and will not be explained in detail.

Figure 7:
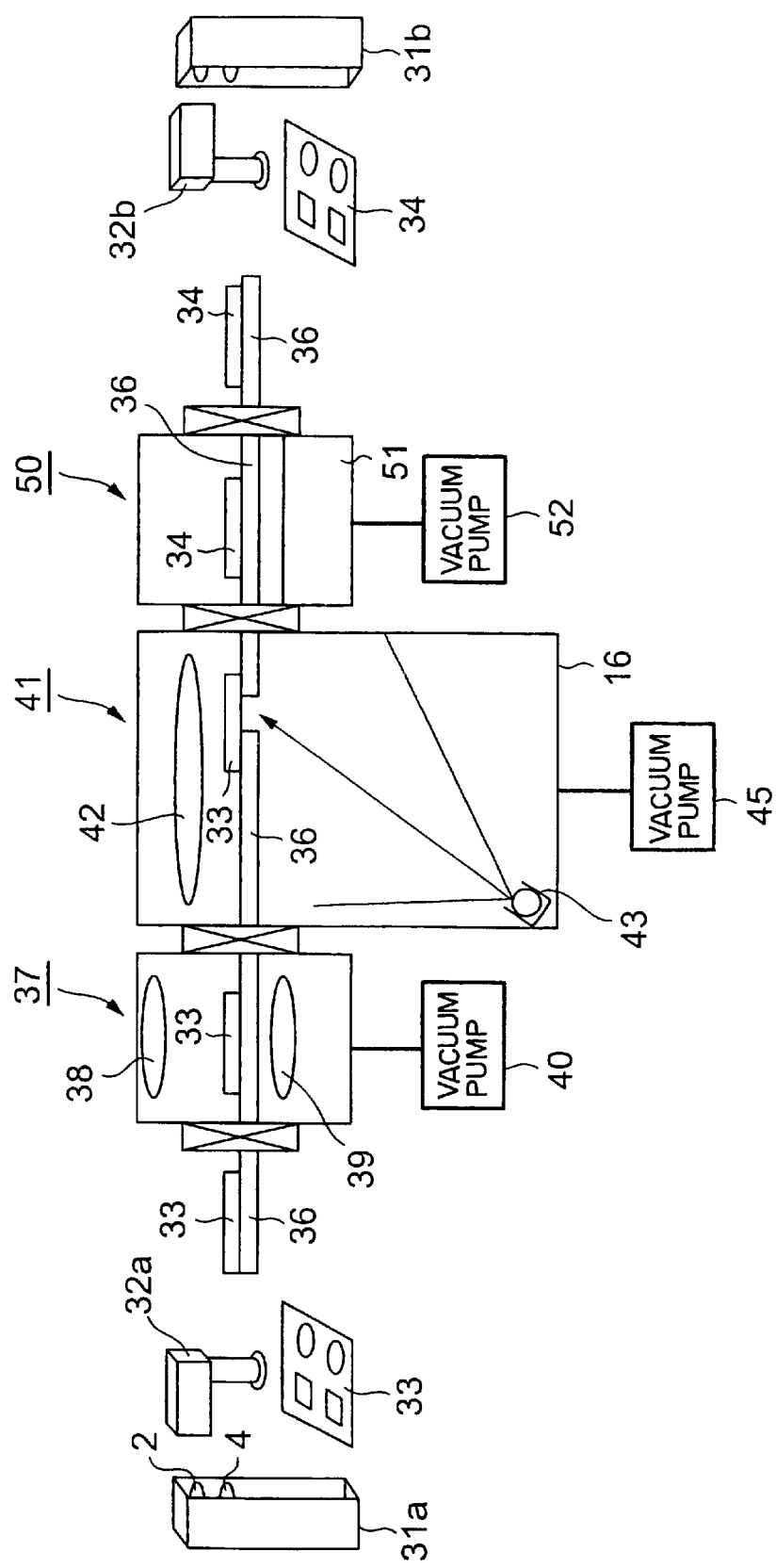
FIG. 7 is view showing the entire structure of a liquid crystal display production apparatus (alignment layer deposition apparatus) according to the present invention.

Disclosed first with reference to FIG. 7 is a liquid crystal display production apparatus (alignment layer deposition apparatus) 30.

A substrate cassette 31a is partitioned into several containers in which glass substrates 2, silicon IC substrates 4, etc., are contained. These substrates are taken out from the containers and loaded onto each substrate tray 33 by an auto-loading mechanism 32a. The substrate tray 33 is placed on the flat surface of a substrate transfer table 36. Several substrate trays 33 are intermittently or sequentially moved in an auto-unloading direction by a transfer mechanism (not shown) installed in the substrate transfer table 36.

A feature of this embodiment is that it is possible to transfer several substrate trays 33 on the substrate transfer table 36 intermittently or sequentially by the transfer mechanism (not shown). This intermittent or sequential transfer of the several substrate trays 33 achieves tact-time shortening and hence high productivity.

Each substrate tray 33 is loaded into a first load-lock chamber 37 for thermal processing while pumping out moistures generated inside the chamber. The load-lock chamber 37 has lamps 38 and 39 which are arranged so that the substrate transfer table 36 can be set between the lamps. The lamps 38 and 39 are preferably halogen lamps for heating the glass substrates 2 and the silicon IC substrates 4 at 150° C. or higher for tact-time shorting. Other heating means may also be used, such as a sheath heater.

Connected to the first load-lock chamber 37 is a vacuum pump 40 such as a cryopump for pumping out moistures attached to the glass substrates 2, the silicon IC substrates 4 and the substrate tray 33. It may be a turbopump with a water-trapping function.

The liquid crystal display production (alignment layer deposition) apparatus 30 is equipped with a deposition chamber 41 which is the main section of the apparatus. An evaporation source 43 is heated in the deposition chamber 41 for oblique evaporation while a vacuum is being created by a vacuum pump 45. A sheath heater 42 is set over the substrate transfer table 36 whereas the evaporation source 43 and an electron-beam gun, a layer-thickness sensor, etc (not shown) are set under the table 36.

The glass substrates 2 and the silicon IC substrates 4 subjected to oblique deposition in the deposition chamber 41 are transferred to a second load-lock chamber 50 equipped with a cooler 51 and a vacuum pump 52 for cooling procedure. A recommended cooling temperature in the second load-lock chamber 50 is 150° C. or lower. This cooling temperature is helpful for avoiding change in layer properties of oxide silicon which could occur due to air contamination when the substrates are taken out from the apparatus 30.

A substrate tray 34 on which the cooled glass substrates 2 and silicon IC substrates 4 have been placed is taken out from the second load-lock chamber 50 and loaded into a substrate cassette 31b by an auto-loading mechanism 32b. Like the substrate cassette 31a, the substrate cassette 31b is partitioned into several containers.

Figure 8:
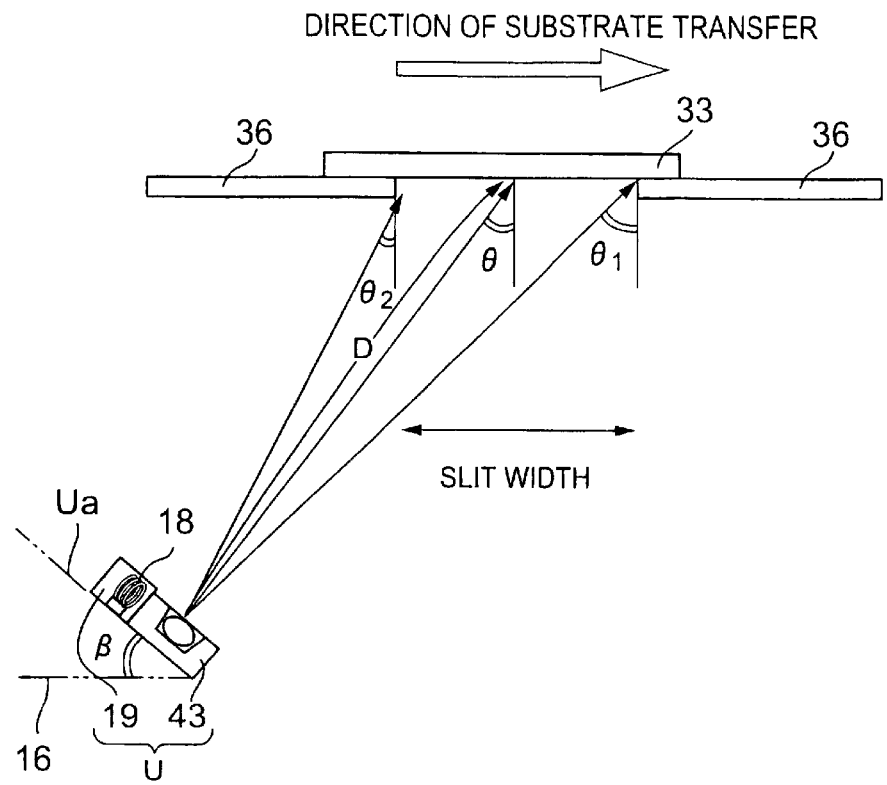
FIG. 8 is an illustration of arrangements in the liquid crystal display production apparatus (alignment layer deposition apparatus) according to the present invention, for restricting variation in evaporation angle.
Figure 9:
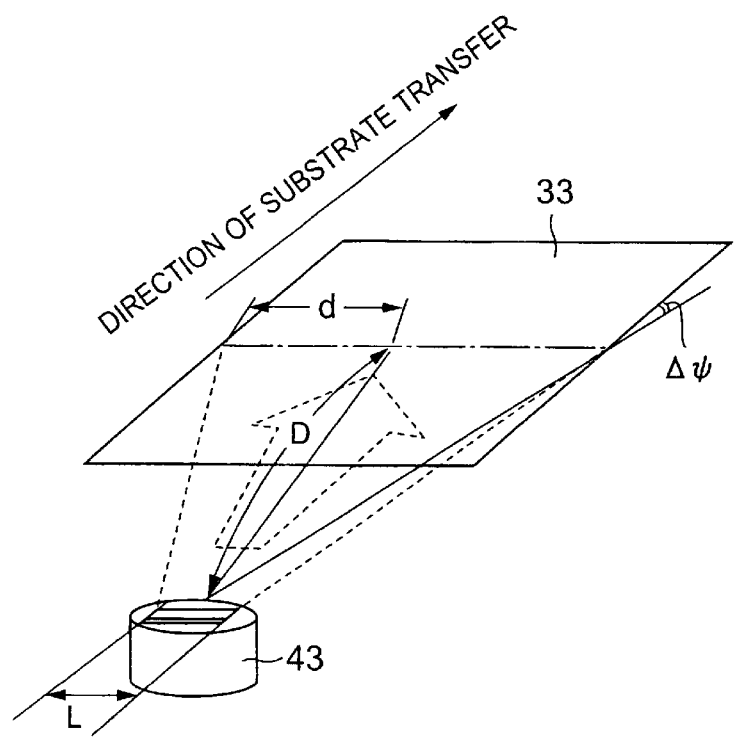
FIG. 9 is an illustration of arrangements in the liquid crystal display production apparatus (alignment layer deposition apparatus) according to the present invention, for restricting variation in twist angle.

The liquid crystal display production (alignment layer deposition) apparatus 30 shown in FIG. 7 will be disclosed more in detail with reference to FIGS. 8 and 9, for processing large glass substrates 2 and silicon IC substrates for higher productivity.

The substrate tray 33 on which large glass substrates 2 and also large silicon IC substrates 4 are loaded into the first load-lock chamber 37 by the auto-loading mechanism 32a, for thermal processing while pumping out moistures generated inside the chamber.

The substrate tray 33 for which the vacuum and substrate temperature have reached to desired values in the first load-lock chamber 37 is transferred to the deposition chamber 41. The glass substrates 2 and the silicon IC substrates 4 are heated by the sheath heater 42 in the deposition chamber 41 so that the substrate-surface temperature will be kept in the range from 100° C. to 300° C., preferably 150° C. or higher for higher image quality.

The deposition distance D is preferably 1000 mm or longer. The oblique evaporation angle θ is preferably in the range from 45° to 60°. An electron-beam gun unit U having a crucible 11 and an electron gun 19 with a filament 18 is set in the deposition chamber 41. In detail, the electron-beam gun unit U is set so that its angle (angle β in the direction of the normal line on the crucible's opening) will be in the range from 30° to 60° from the direction 17 (FIG. 3) of the normal line on a base 16 of the apparatus 30. The angle β corresponds to the angle formed between the base 16 of the apparatus 30 and a base Ua of the unit U.

For deposition (vacuum deposition) in the deposition chamber 41, the evaporation source 43 (oxide silicon, or SiOx: $0 \leq x \leq 2.0$), the substrate transfer tables 36, the substrate tray 33, etc., are arranged as illustrated in FIG. 8 under the requirement $0 \leq \Delta\theta \leq 3°$ in $\Delta\theta = \tan^{-1}(d\cos\theta/(D+d\sin\theta))$ in which "d" is the distance from the substrate center to the substrate edge required for alignment-layer deposition and "D" is the distance from the substrate center to the center of the evaporation source 43 also for alignment-layer deposition.

The arrangements under the requirement achieves uniformity of angle of thin-layer deposition for oxide silicon deposited on each substrate and also uniformity of liquid crystal molecules aligned on the layer of oxide silicon, for high image quality for liquid crystal displays.

The relations between the evaporation angles and image quality for liquid crystal displays under the requirement are indicated in FIG. 10. It is apparent from FIG. 10 that evaporation-angle settings in the specific ranges such as from 50° to 55° achieve decrease in disclinations, for liquid crystal displays with high contrast ratio. The disclinations are defects that will occur to images on liquid crystal displays.

A deposition rate for oxide silicon as the evaporation source 43 is preferably in the range from 1 to 10 angstroms/second. A more recommended rate is 5 angstroms/second or higher under the oxygen partial pressure in the range from $1 \times 10^{-2} \sim 5 \times 10^{-2}$ Pa in the deposition chamber 41, for achieving the deposited layer thickness of 500 angstroms or more.

In transfer of the substrate tray 33 during deposition illustrated in FIG. 8, arrangements in which a slit width (a slit being formed between the two substrate transfer tables 36) is 150 mm and a deposition distance D is 1000 mm keep angle variation at ±3° from an evaporation angle of 50°. This means $\theta_1 - \theta = \Delta\theta$ (+3°) and $\theta - \theta_2 = \Delta\theta$ (−3°) in which $\theta_1$ and $\theta_2$ are the evaporation angles at which substrate transfer has proceeded to +3° and −3°, respectively, from the evaporation angle θ.

These settings provide alignment layers of oxide silicon at a constant angle of thin-layer deposition on the entire surface of the glass substrates 2 and the silicon IC substrates 4 placed on the substrate tray 33 while transferred as shown in FIG. 8, even though the substrates 2 and 4 are large, for example, at 150 mm-size or larger.

Moreover, as already disclosed, the angle (direction) of the electron-beam gun unit U (angle β in the direction of the normal line on the oxide silicon crucible's opening) is preferably set in the range from 30° to 60° in the vertical direction (in the direction of the normal line) of the apparatus 30, or from the base 16 of the apparatus 30 (FIG. 8). This angle setting is made so that evaporated particles of oxide silicon from the electron-beam gun unit U as the evaporation source can be efficiently dispersed onto the substrate surface in an oblique direction, for high productivity in alignment layer of oxide silicon formed at a uniform angle of thin-layer deposition with oblique deposition.

Each substrate tray 33 is transferred, after layer deposition, to the second load-lock chamber 50 for cooling the glass substrates 2 and the silicon IC substrates 4 with the cooler 51. In detail, the substrates are subjected to tight contact with a cooling plate while a nitrogen gas is being charged into the load-lock chamber 50. The substrate tray 34 carrying the substrates 3 and 4 on which alignment layers of oxide silicon have been formed is preferably taken out from the second load-lock chamber 50 after that the substrate temperature goes down to 150° or lower. Taking out the substrate tray 34 from the apparatus 30 over 150° will cause change in oxidation, as already discussed.

Disclosed next with reference to FIG. 9 is how to counteract variation in twist angle $\Delta\psi$ which will occur for a large glass substrate 2 in the direction in which the oxide silicon 12 growns as a column-shaped structure.

For deposition in the deposition chamber 41, the evaporation source 43, the substrate transfer table 36, the substrate tray 33, etc., are arranged as illustrated in FIG. 9 under the requirement $0 \leq \Delta\psi \leq 3°$ in $\Delta\psi = \tan^{-1}((d-L/2) \cos \theta/(D+d-L/2) \sin \theta))$ in which "d" is the distance from the center to the edge of a substrate required for alignment-layer deposition, "D" is the distance from the center of the substrate to the center of the evaporation source 43 also for alignment-layer deposition, and "L" is the length of the evaporation source 43 in the direction perpendicular to the direction in which each substrate is transferred in the deposition chamber 41.

The arrangements under the requirement achieves uniformity of angle of thin-layer deposition for oxide silicon deposited on each substrate and also uniformity of liquid crystal molecules aligned on the oxide silicon, for high image quality for liquid crystal displays.

Figure 12:
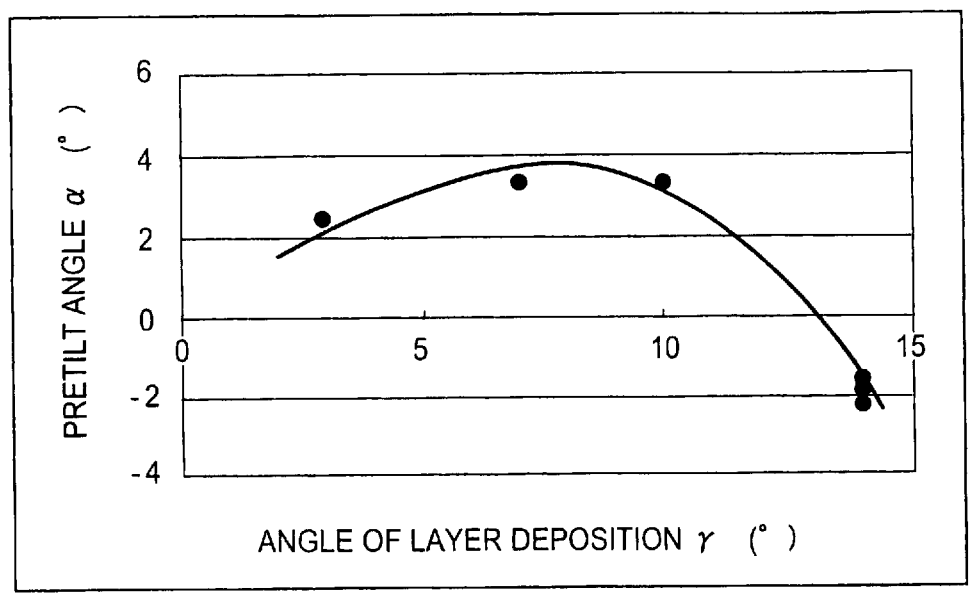
FIG. 12 is a view showing relations between evaporation angles of layer deposition and pretilt angles.

FIG. 12 shows the relation between angles of layer deposition γ for alignment layers of oxide silicon and pretilt angles α.

Figure 1:
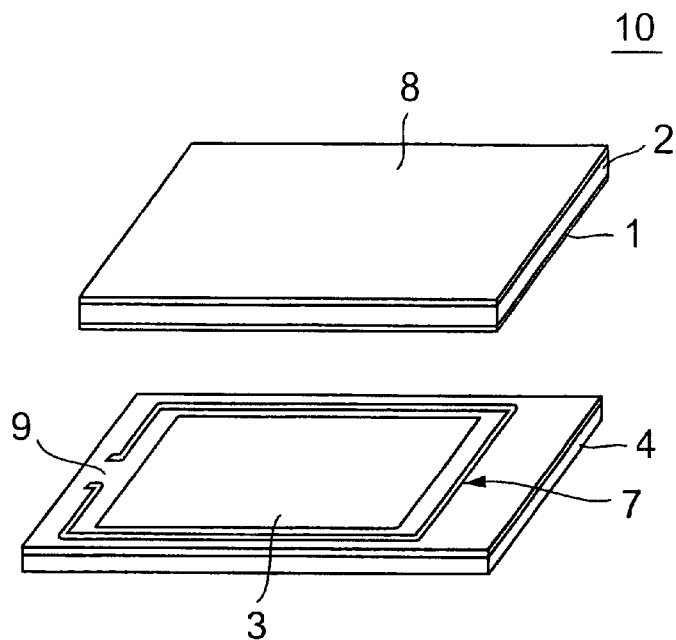
FIG. 1 is an exploded perspective view of a known liquid crystal display.
Figure 2:
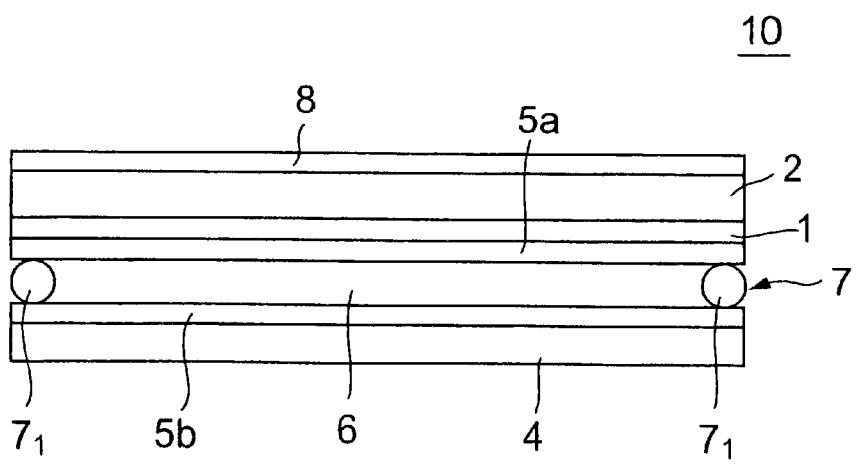
FIG. 2 is a sectional view of the known liquid crystal display shown in FIG. 1.
Figure 3:
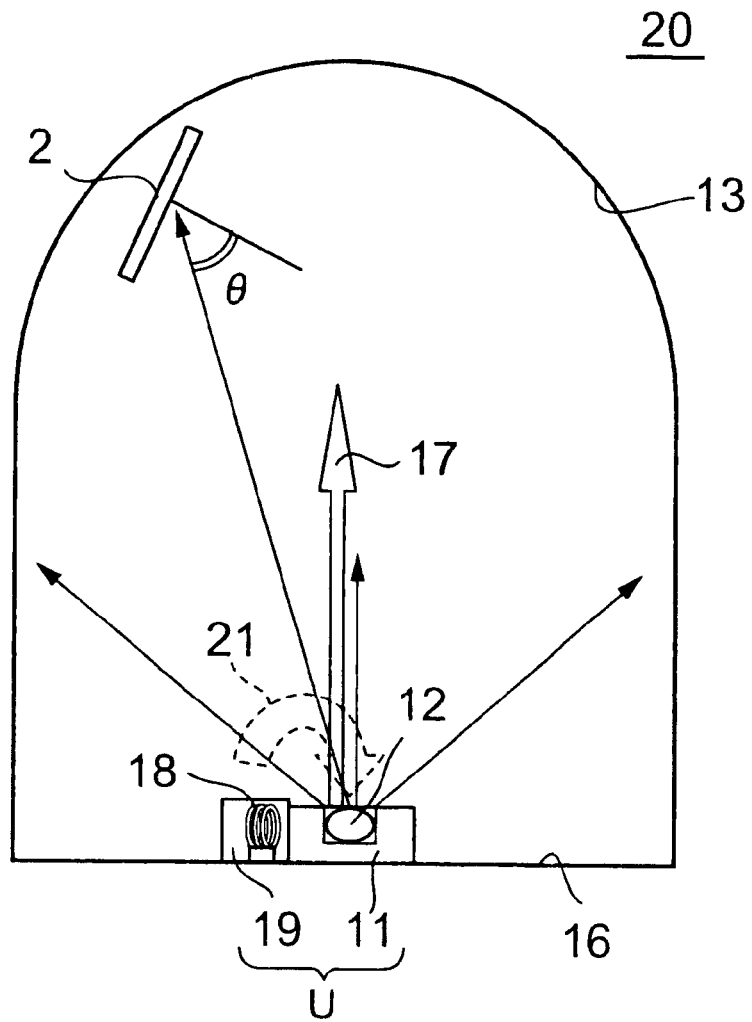
FIG. 3 is an illustration of oblique evaporation method in a known electron-beam deposition apparatus.
Figure 4:
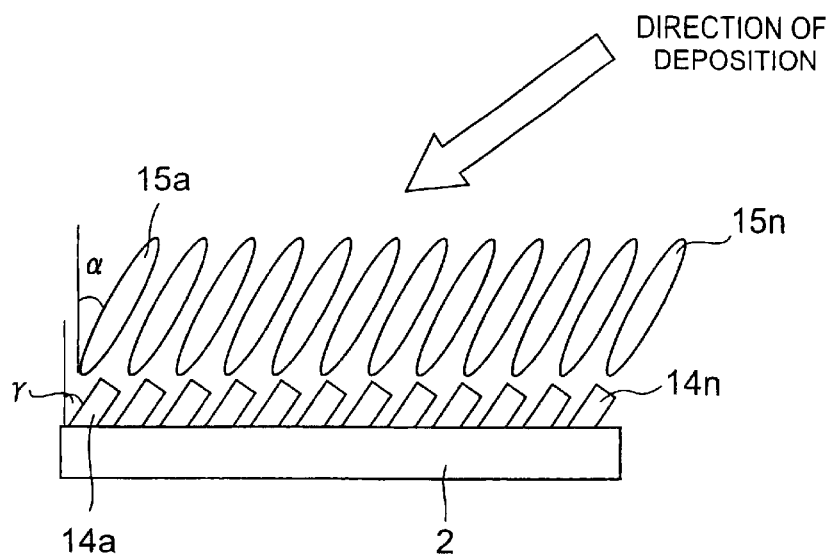
FIG. 4 is an exaggerated illustration of oblique perpendicular alignment in the known electron-beam deposition apparatus.
Figure 5:
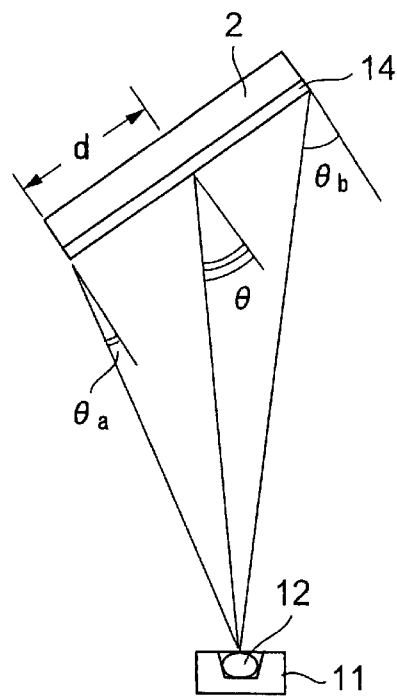
FIG. 5 is an illustration of variation in evaporation angle in the known electron-beam deposition apparatus.
Figure 6:
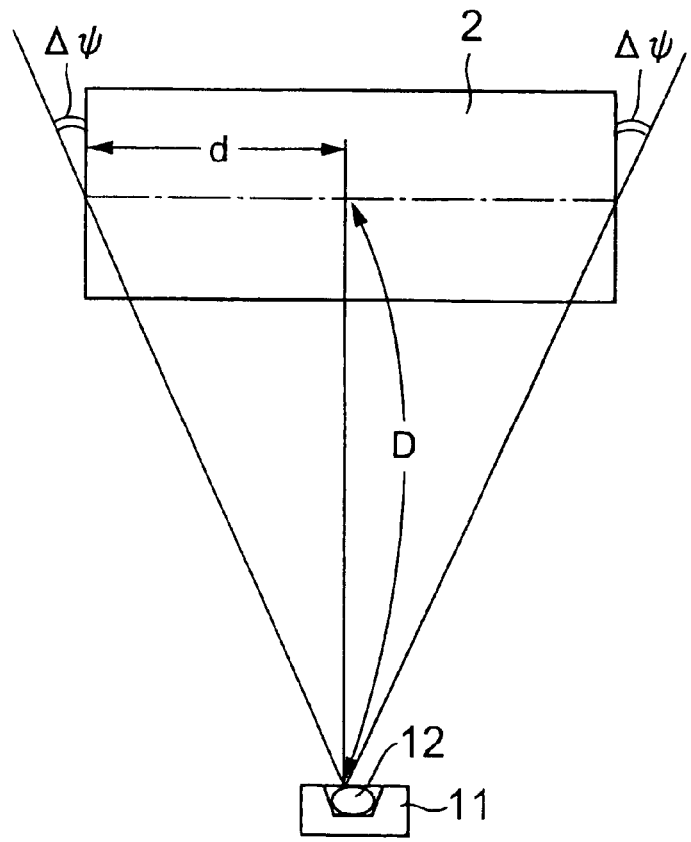
FIG. 6 is an illustration of generation of twist angles in the known electron-beam deposition apparatus.

The angles of layer deposition γ in FIG. 12 are the angles of alignment layers such as the layers 14a to 14n formed on the glass substrate 2, as shown in FIG. 4. In other words, an angle γ is the angle between the direction of normal line on the substrate and the direction in which layers are deposited. The angles of layer deposition γ in FIG. 12 were found while the cross-section of the alignment layers were observed under a transmission electron microscope (TEM) or a scanning electron microscope (SEM).

The pretilt angles α in FIG. 12 were obtained with a crystal rotation method applied to liquid crystals filled between two glass substrates with alignment layers formed thereon, stuck to each other with a 50 ìm-gap. Several pretilt angles were observed on several glass substrates having different angles of layer depostion, produced under different requirements to oblique evaporation angle θ, pressure in the deposition chamber 41, substrate temperature, thickness in alignment layer, etc.

FIG. 12 teaches that the pretilt angle α becomes large as the angle of layer deposition γ becomes large, and it reaches the peak when the angle γ is about 7° and then becomes smaller as the angle γ becomes larger. It is also taught in FIG. 12 that the pretilt angle α in the range from 2° to 4°, the requirements of achieving a desired contrast ratio under vertical liquid-crystal alignment, disclosed later, are met by setting the angle of layer deposition γ for oxide silicon layers in the range from 3° to 10°.

Disclosed next are embodiments of liquid crystal displays produced by the liquid crystal display production (alignment layer deposition) apparatus 30 shown in FIG. 7. The embodiments of liquid crystal display will not be shown for brevity because their appearance are similar to that shown in FIGS. 1 and 2.

[Embodiment 1]

A first embodiment of a reflective liquid crystal display has an alignment layer 5a of oxide silicon formed on a glass substrate 2 having a transparent electrode layer ITO thereon and another alignment layer 5b of oxide silicon formed on a silicon IC substrate 4 having reflective pixel electrodes (image displaying area) 3 thereon, to which a drive voltage is to be supplied via CMOS transistors.

The alignment layers 5a and 5b having oxide silicon of about 600 to 650 angstroms in thickness are formed by electron-beam evaporation under the requirements: 50° to 55° in evaporation angle θ, 150° C. to 200° C. in substrate temperature, 5 angstroms/second in deposition rate, and about 20 SCCM in oxygen gas flow rate.

One of the substrates is applied WR-series main sealing adhesive made by KYORITU CHEMICAL & CO., LTD. mixed with SW-series spacer balls made by YAKUSHI CO., LTD. The two substrates 2 and 4 are pressed to be stuck to each other. N-type nematic liquid crystals 6 are filled and aligned by vertical alignment between the two substrates 2 and 4.

The reflective liquid crystal display in the first embodiment exhibits 170:1 to 180:1 in contrast ratio of light intensity at 1.5V-drive voltage to the maximum light intensity. This contrast ratio is enough for achieving 1000:1 or more in contrast ratio when the first embodiment is applied to optical equipment such as a projector.

Discussed next is how to restrict variation in evaporation angle θ and twist angle ψ.

Variation in evaporation angle θ, which could occur when the liquid crystal display in the first embodiment is made larger than a regular size, can be restricted with a particular slit width decided as disclosed below. The slit width corresponds to the area of a substrate that is exposed to evaporated particles of oxide silicon in accordance with the distance from the substrate center to the center of the evaporation source, in the liquid crystal display production (alignment layer deposition) apparatus 30.

Such a slit width in the direction of substrate transfer can be decided, for example, as about 173 mm from the equation $\Delta\theta = \tan^{-1}(d\cos \theta/(D+d\sin \theta))$, for restricting variation in evaporation angle θ within ±3° when the deposition distance D is 1000 mm and the evaporation angle is 50° in FIG. 8.

Variation in twist angle ψ could also occur because the slit width is of no useless for protecting the substrate from being exposed to evaporated particles of oxide silicon in the direction perpendicular to the direction of substrate transfer.

Such variation in twist angle can be restricted with a particular long evaporation source 43 decided as disclosed below.

When the deposition distance D is 1000 mm, for example in FIG. 9, the maximum substrate size is decided as 173 mm from the equation $\Delta\psi=\tan^{-1}((d-L/2)\cos\theta/(D+d-L/2)\sin\theta))$, for restricting variation in twist angle $\Delta\psi$ within $\pm3°$.

The substrate size can, however, be made larger to a particular size that corresponds to 173 mm (slit width)+L (the width of the evaporation source 43 that corresponds to electron-beam scanning width in the direction perpendicular to the direction of substrate transfer), for restricting variation in twist angle $\Delta\psi$ within $\pm3°$. For example, the width in evaporation source of 27 mm can restrict variation in twist angle $\Delta\psi$ within $\pm3°$ for 8 inch-, or 200 mm-substrates.

Even under the arrangements disclosed above, evaporated particles of oxide silicon could involve components with the twist angle $\Delta\psi$ of 3° or larger.

Figure 11:
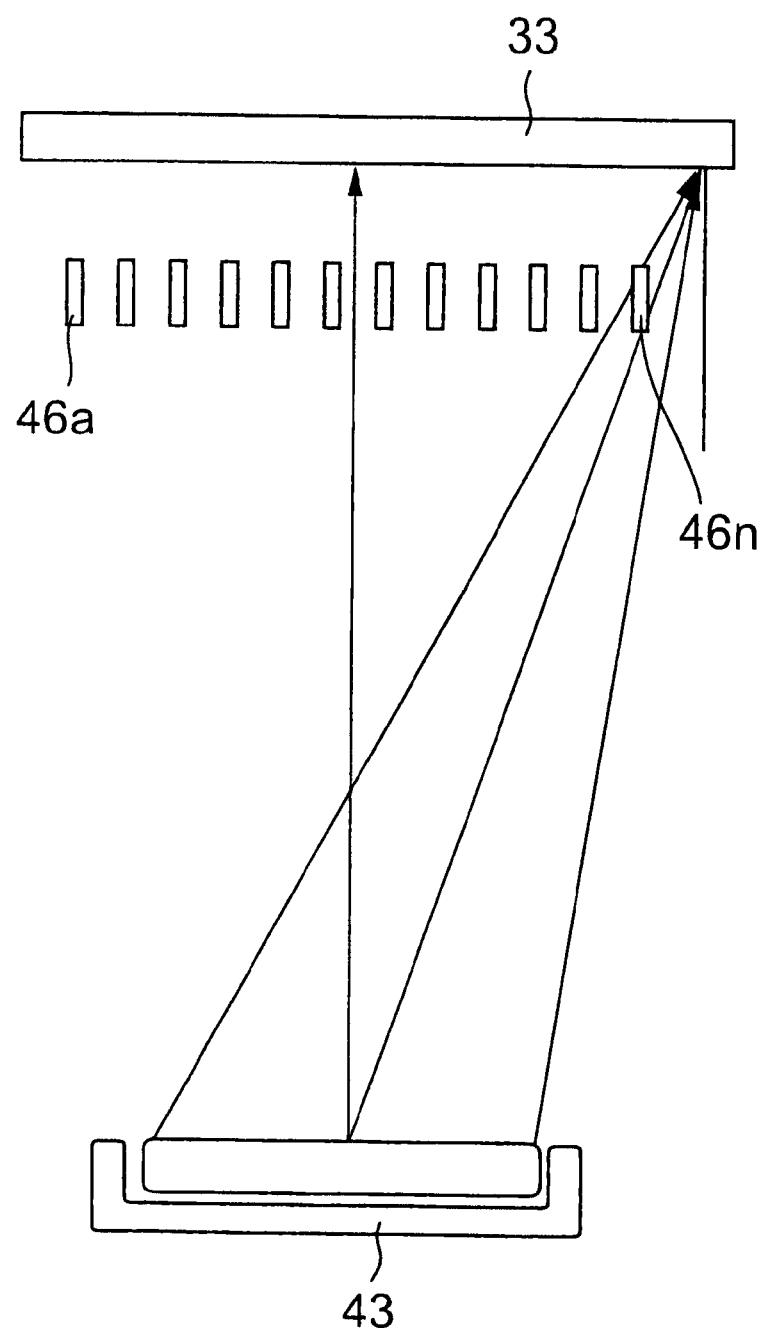
FIG. 11 is an illustration of arrangements in the liquid crystal display production apparatus (alignment layer deposition apparatus) according to the present invention, equipped with twist-angle correction plates.

Such components can be prevented from irradiating the substrate with twist-angle correction plates as illustrated in FIG. 11. In detail, several twist-angle correction plates 46a to 46n are provided in front of the substrate tray 33 at the evaporation source side. The substrate surface can be protected by the twist-angle correction plates 46a from being exposed to evaporated particles of oxide silicon at the twist angle $\Delta\psi$ of 3° or larger, so that the twist angle $\Delta\psi$ can be restricted to smaller than 3° on the entire substrate surface.

[Embodiment 2]

A second embodiment of a reflective liquid crystal display also has an alignment layer 5a of oxide silicon formed on a glass substrate 2 having a transparent electrode layer ITO thereon and another alignment layer 5b of oxide silicon formed on a silicon IC substrate 4 having reflective pixel electrodes (image displaying area) 3 thereon, to which a drive voltage is to be supplied via CMOS transistors.

The alignment layers 5a and 5b having oxide silicon of about 600 to 650 angstroms in thickness at 3° to 10° in angle of layer deposition are formed by electron-beam deposition under the requirements: 40° to 50° (or 45° to 55°) in evaporation angle θ, 150° C. to 200° C. in substrate temperature, 5 angstroms/second in deposition rate, and 50 to 100 SCCM in oxygen gas flow rate.

One of the substrates is applied WR-series main sealing adhesive made by KYORITU CHEMICAL & CO., LTD. mixed with SW-series spacer balls made by YAKUSHI CO., LTD. The two substrates 2 and 4 are pressed to be stuck to each other. N-type nematic liquid crystals 6 are filled and aligned by perpendicular alignment between the two substrates 2 and 4.

The reflective liquid crystal display in the second embodiment exhibits 50:1 to 100:1 in contrast ratio of light intensity at 1.5V-drive voltage to the maximum light intensity. This contrast ratio is enough for achieving 1000:1 or more in contrast ratio when the second embodiment is applied to optical equipment such as a projector.

This contrast ratio, particularly, at the evaporation angle θ in the range from 45° to 55° is satisfactory and reproducible compared to that at the same evaporation angle range with the gap of 30 mm or larger between the substrate and substrate transfer table in the known apparatus. This gap between the substrates and the substrate transfer table will be discussed later.

In the liquid crystal display production (alignment layer deposition) apparatus 30 for producing the reflective liquid crystal display in the first embodiment, several substrate trays 33, on which the glass substrates and the silicon IC substrates are set, are placed on the substrate transfer table 36. And, they are intermittently or sequentially transferred in an auto-unloading direction with a transfer mechanism (not shown), as illustrated in FIG. 8.

As already discussed, in FIG. 8, the deposition distance D and the oblique evaporation angle θ are preferably 1000 mm and in the range from 45° to 60°, respectively. The electron-beam gun unit U is set in the deposition chamber 41 so that its angle (angle β in the direction of the normal line on the crucible's opening) may be in the range from 30° to 60° from the normal line 17 (FIG. 3) on the base 16 of the apparatus 30.

For deposition in the deposition chamber 41, the evaporation source 43, the substrate transfer table 36, the substrate tray 33, etc., are arranged as illustrated in FIG. 8 under the requirement $0 \leq \Delta\theta \leq 3°$ in $\Delta\theta=\tan^{-1}(d\cos\theta/(D+d\sin\theta))$ in which "d" is the distance from the center to the edge of a substrate required for alignment-layer deposition and "D" is the distance from the center of the substrate to the center of the evaporation source 43 also for alignment-layer deposition.

The arrangements under the requirement in the apparatus 30 partially protect substrates from being exposed to evaporated particles of oxide silicon during transfer. This achieves uniformity of thin angle of layer deposition for oxide silicon deposited on each substrate with almost no variation in evaporation angle on the substrate surface and also high image quality for liquid crystal displays.

It is, however, inevitable that the following problems could occur due to variation in component size for the liquid crystal display production (alignment layer deposition) apparatus 30.

Figure 13:
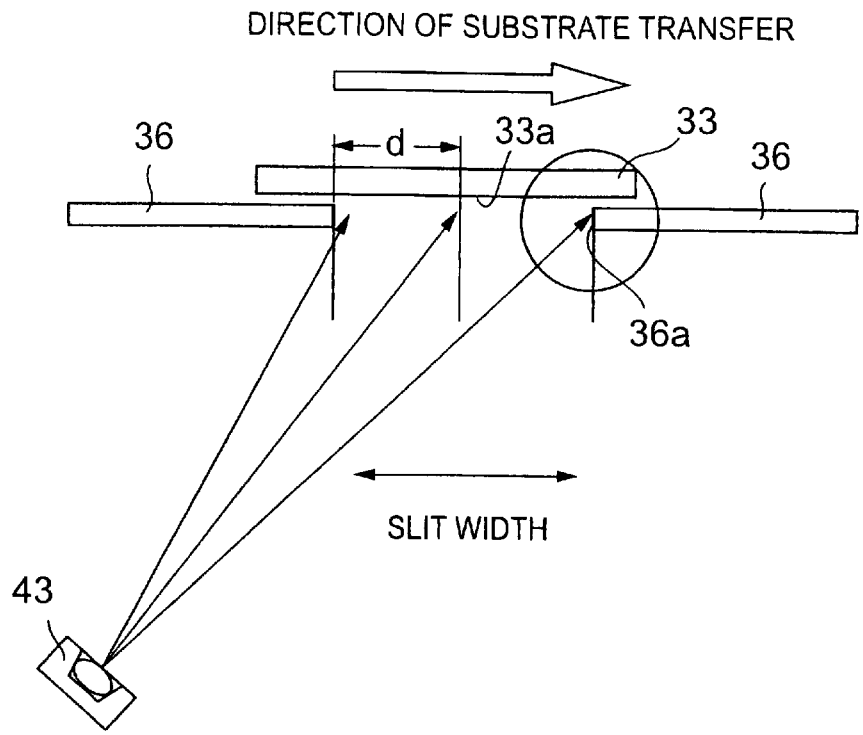
FIG. 13 is an illustration of defective deposition due to inappropriate apparatus arrangements.
Figure 14:
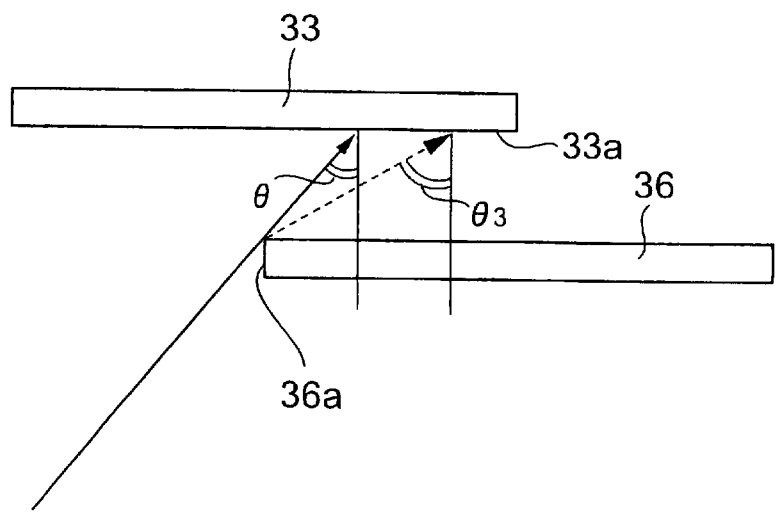
FIG. 14 is an illustration of defective deposition due to inappropriate apparatus arrangements.

In detail, as illustrated in FIGS. 13 and 14, the gap between the moving substrate tray 33 and the substrate transfer tables 36 (a substrate-shielding structure) could be unnecessary large.

Under such inappropriate arrangements in apparatus structure, evaporated particles of oxide silicon could irradiate the substrate surface 33a at an angle $\theta_3$ larger than the set evaporation angle θ as indicated by a dot line in FIG. 14 from a slit edge 36a of one of the substrate transfer tables 36 possibly due to a diffraction phenomena.

This causes a defective layer deposition at the evaporation angle $\theta_3$ on the substrate surface 33a because layer deposition is completed at the slit edge 36a while the substrate tray 33 is moving (the layer is being deposited) in the right direction in FIG. 14.

Such an inappropriate deposition causes inferior image quality, for example, a low contrast ratio, thus resulting in variation in quality of liquid crystal displays.

Figure 15:
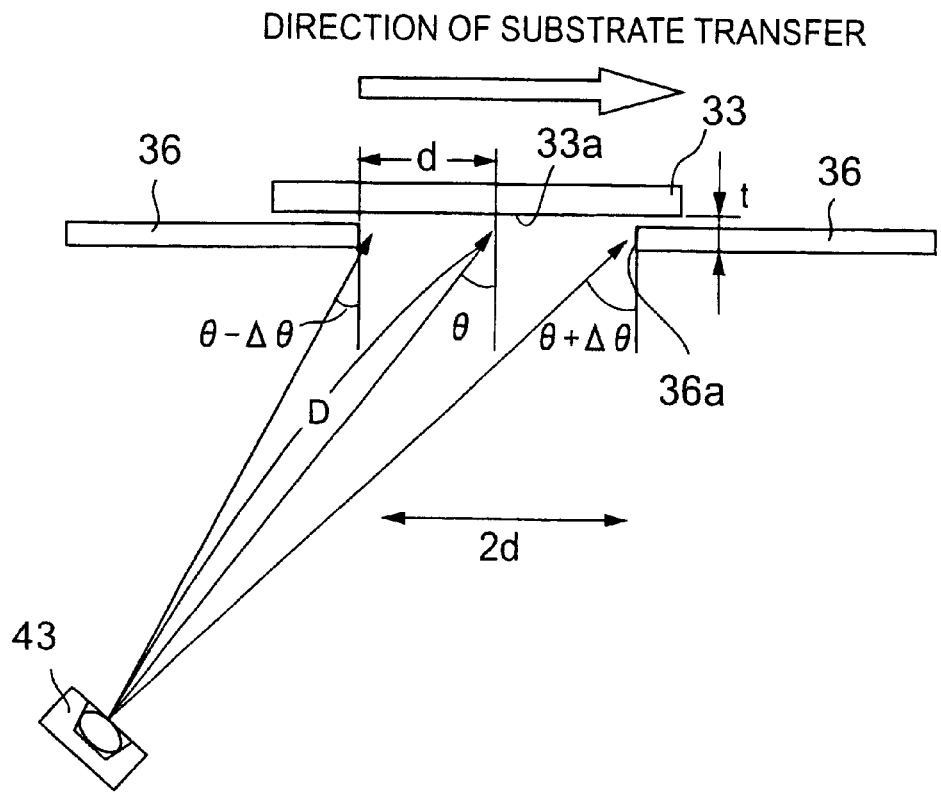
FIG. 15 is an illustration of a modification to the liquid crystal display production apparatus (alignment layer deposition apparatus) according to the present invention.
Figure 16:
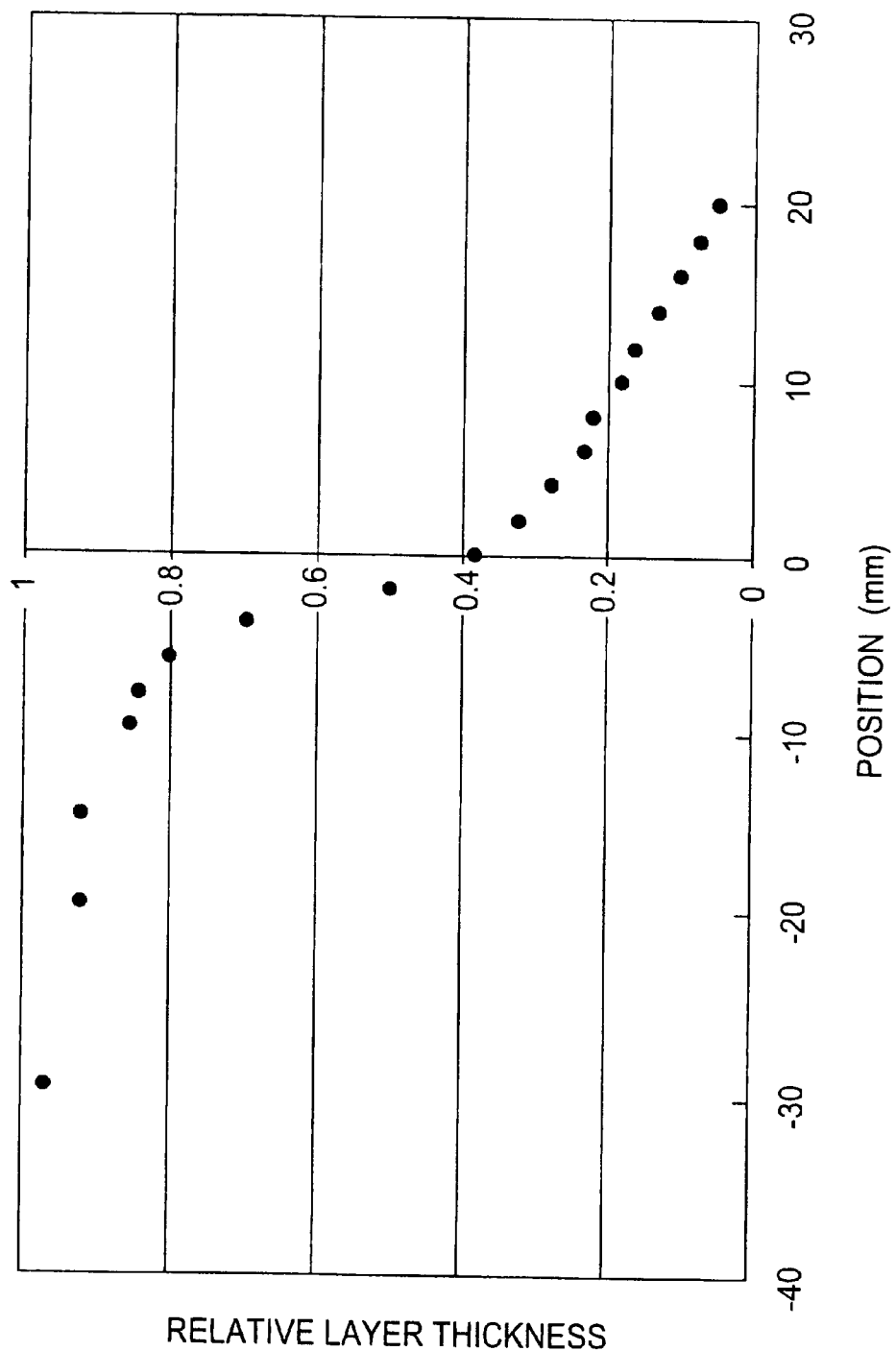
FIG. 16 is a graph indicating excess layer thickness caused by leakage through the slit shielding.
Figure 17:
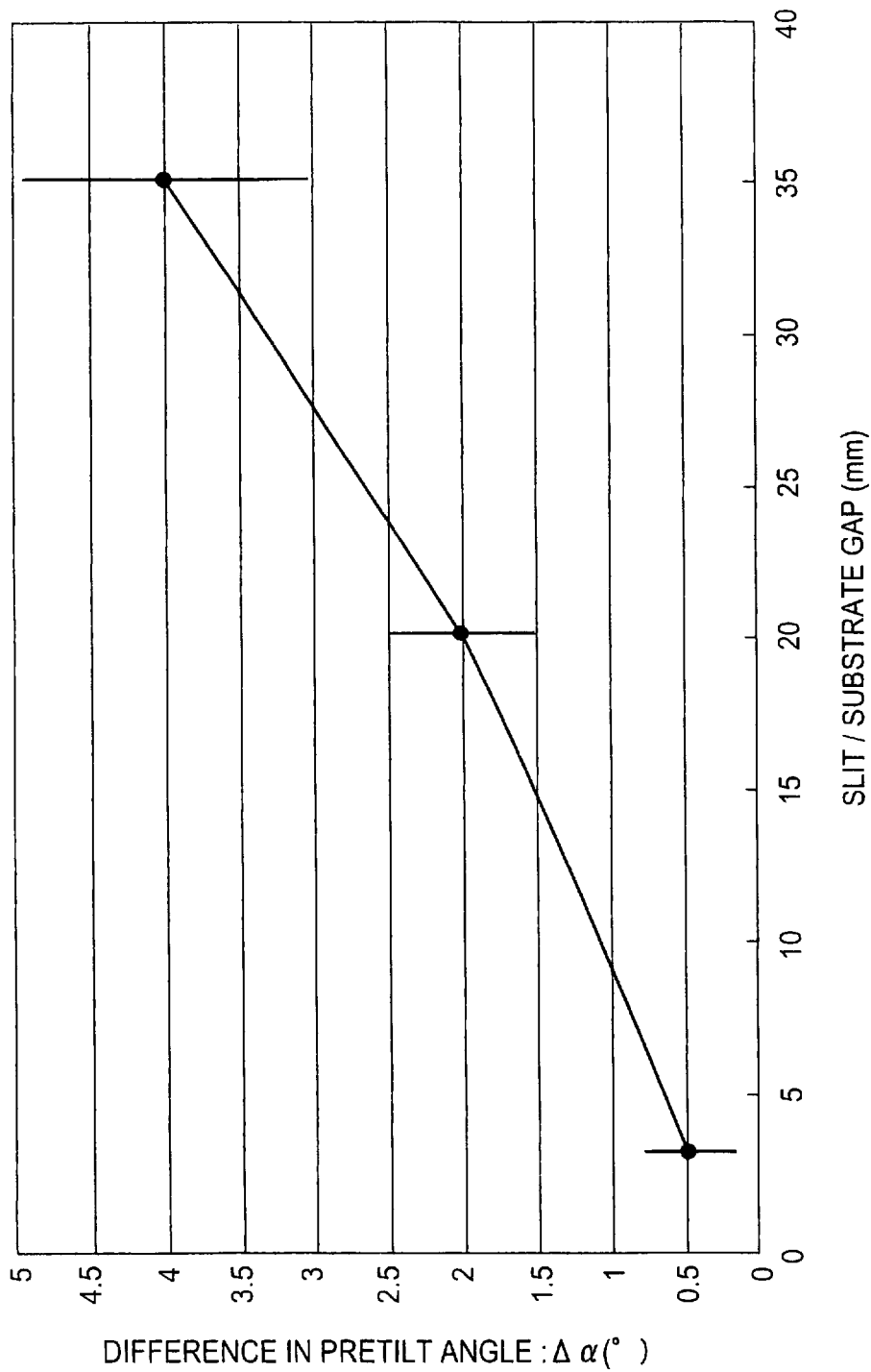
FIG. 17 is a graph indicating differences in pretilt angle between alignment-layer deposition while a substrate is being transferred and that while a substrate remains stationary.

Disclosed next with reference to FIGS. 15 to 17 is a modification to the liquid crystal display production apparatus (an alignment layer deposition apparatus) 30, for avoiding such an inappropriate deposition.

In this modification, the substrate tray 33 and the substrate transfer tables 36 (the substrate-shielding structure) are arranged as being parallel to the direction of substrate transfer, with a gap "t" of 3 mm or less in the vertical direction between the tray 33 and the table 36, for producing liquid crystal displays of high image quality.

One of the requirements has already been discussed that, in FIG. 12, the evaporation angle θ be within $\pm3°$ ($\Delta\theta$) on a substrate (not shown here) to be formed an alignment layer thereon within the slit while the substrate tray 33 is moving, with the distance "D" between the center of the evaporation source 43 and the substrate center and the distance "d" between the substrate center and the substrate edge. The slit width equals to $2d$.

Another requirement in this modification is that the distance (gap) "t" between the substrate surface 33a and the substrate transfer tables 36 (the substrate-shielding structure), the slit being formed therebetween, set as being parallel to the direction of substrate transfer, be 3 mm or smaller in the vertical direction.

The reason for deciding such requirement in the modification will be discussed with reference to FIGS. 16 and 17.

FIG. 16 indicates relative layer thickness at the slit edge obtained by experiments in which the substrate surface 33a was exposed to evaporated particles of oxide silicon at the evaporation angle of 50° under the requirement that the gap between the substrate surface 33a and the substrate transfer tables 36 (the substrate-shielding structure) was 35 mm while the substrate remains stationary. Dots (•) on a curve in FIG. 16 indicate a layer-thickness ratio. It is found that evaporated particles of oxide silicon were deposited on the substrate surface 33a in the range from the area on which they were ideally deposited to the area about 20 mm distant from the ideal area (called over-deposition hereinafter). The distance of 20 mm corresponds to increase of 10° from the calculated evaporation angle 50°.

It is experimentally known that these results can be applied to the optimum evaporation angle range 45° to 55° for gaining a desired pretilt angle for liquid-crystal alignments. In detail, deposition of alignment layers at the evaporation angle in the range of 45° to 55° results in that there are portions of alignment layers, which are actually formed at the evaporation angle in the range of 55° to 65° over the substrate.

The effects of excess layer thickness due to over-deposition discussed above to the alignment property (pretilt angle α) can be evaluated based on whether there is a difference (Δα) in pretilt angle between alignment-layer deposition while a substrate is being transferred and that while a substrate remains stationary.

This evaluation is indicated in FIG. 17 in which the pretilt angle α was observed at the substrate center in case of alignment-layer deposition while a substrate remains stationary.

FIG. 17 teaches that the differences (Δα) in pretilt angle are in the range from 3° to 5° for 35 mm-gap "t" between the substrate and the slit, 1.5° to 2.5° for 20 mm-gap "t", and 0.2° to 0.8° for 3 mm-gap "t".

It is empirically and statistically known that a constant contrast ratio is reproducible when variation in pretilt angle is within 1° in production of liquid crystal displays.

The difference in pretilt angle leads to variation in pretilt angle which could be caused during production of liquid crystal displays because the difference is caused by variation in gap "t" between the substrate and the slit. It is thus concluded that the gap "t" of 3 mm or smaller is the requirement of precise pretilt-angle control with less variation in evaporation angle (over-deposition), which may otherwise affect the contrast ratio in image quality.

As disclosed, according to the invention, alignment layers to be used for liquid crystal displays each having at least two substrates with liquid crystals sealed therebetween can be formed as follows:

The substrates placed on each of several substrate trays are heated in a first load-lock chamber. At least one of the two substrates is irradiated with evaporated particles of oxide silicon (SiOx: $1.0 \leq x \leq 2.0$) by vacuum deposition at an angle in the range from 45° to 60° deposit a direction of the normal line on the substrate surface to form an alignment layer thereon while the substrate trays are being moved in a layer-deposition chamber intermittently or sequentially. The substrate trays are then cooled in a second load-lock chamber.

This method thus offers a uniform angle of layer deposition for alignment layers.

Such uniform angle of layer deposition can further be achieved by setting the deposition chamber under a requirement $0 \Delta \theta 3°$ in $\Delta\theta = \tan^{-1}(d\cos\theta/(D+d\sin\theta))$, "d" a distance from the substrate center to the center of a substrate edge, "D" a distance from the substrate center to the center of an evaporation source containing the oxide silicon, and θ an angle formed between a direction in which the normal line extends on the substrate center and another direction in which evaporated particles of oxide silicon are deposited on the substrate center from the evaporation source.

Moreover, according to the invention, the electron-gun unit having the evaporation source is installed in the deposition chamber at an angle in the range from 30° to 60° from the normal line on the base of the deposition chamber, thus the evaporated particles of oxide silicon being dispersed from the evaporation source in a specific direction towards the substrate. The arrangements achieve tact-time shortening and hence high productivity for liquid crystal displays.

Moreover, according to the invention, an alignment layer can be formed on at least one of the two substrates under a requirement $0 \leq \Delta\psi \leq 3°$ in $\Delta\psi = \tan^{-1}((d-L/2)\cos\theta/(D+d-L/2)\sin\theta))$ in which "L" is a length of the evaporation source in a direction perpendicular to a direction in which the substrates are transferred in the deposition chamber. The arrangements offer a uniform angle of layer deposition for alignment layers with liquid crystal molecules uniformly aligned thereon, thus achieving almost no image defectiveness.

Such uniform angle of layer deposition can further be achieved by providing twist-angle correction plates in the deposition chamber. The substrate surface is protected by the twist-angle correction plates from being exposed to the evaporated particle of oxide silicon at a twist angle of 3° or larger.

Moreover, according to the invention, the substrate-shielding structure is installed in the deposition chamber, as being parallel to the substrate so as to partially protect the substrate from being exposed to the evaporated particles of oxide silicon and as having a gap of 3 mm or smaller between the substrate surface and the substrate-shielding structure in a direction perpendicular to a direction in which the substrates are transferred in the deposition chamber.

The arrangements offer a uniform angle of layer deposition for alignment layers with liquid crystal molecules uniformly aligned thereon, because a set evaporation angle is reproducible in mass-production, thus achieving uniform properties for liquid crystal displays.

Furthermore, the reflective liquid crystal display according to the present invention has liquid crystals sealed between a transparent substrate and a silicon substrate, and an alignment layer of oxide silicon (SiOx: $1.0 \leq x \leq 2.0$) formed on at least one of the substrates at an angle of layer deposition in the range from 3° to 10° for alignment of the liquid crystals.

Application of this reflective liquid crystal display to visual equipment, such as, projectors and projection TVs, can control the pretilt angle in the range from 2° to 4°, which must be accurate for high contrast ratio. The measurement of angle of layer deposition for alignment layers offers appropriate requirements for producing these layers with no evaluation of pretilt angles and images on sample liquid crystal displays.

What is claimed is:

1. An apparatus for forming an alignment layer to be used for liquid crystal displays each having at least two substrates with liquid crystals sealed therebetween, the apparatus comprising a deposition chamber for forming an alignment layer of oxide silicon (SiOx: $1.0 \leq x \leq 2.0$) on at least one of the two substrates under a requirement $0 \leq \Delta\theta \leq 3°$ in $\Delta\theta = \tan^{-1}(d\cos\theta/(D+d\sin\theta))$ in which "d" is a distance from the substrate center to the center of a substrate edge required for alignment-layer deposition and "D" is a distance from the substrate center to the center of an evaporation source containing the oxide silicon for alignment-layer deposition, and $\theta$ is an angle formed between a direction in which a normal line extends on the substrate center and another direction in which evaporated particles of oxide silicon are deposited on the substrate center from the evaporation source.

2. The apparatus for forming an alignment layer according to claim 1 further comprising an electron-gun unit having the evaporation source, the electron-gun unit being installed in the deposition chamber at an angle in the range from 30° to 60° from a normal line on a base of the deposition chamber, thus the evaporated particles of oxide silicon being dispersed from the evaporation source in a specific direction towards the substrate.

3. The apparatus for forming an alignment layer according to claim 2, wherein the alignment layer is formed on at least one of the two substrates under a requirement $0 \leq \Delta\psi \leq 3°$ in $\Delta\psi = \tan^{-1}((d-L/2)\cos\theta/(D+d-L/2)\sin\theta))$ in which "L" is a length of the evaporation source in a direction perpendicular to a direction in which the substrates are transferred in the deposition chamber.

4. The apparatus for forming an alignment layer according to claim 1 further comprising at least one twist-angle correction plate in the deposition chamber, the substrate surface being protected by the twist-angle correction plate from being exposed to the evaporated particle of oxide silicon at a twist angle of 3° or larger.

5. The apparatus for forming an alignment layer according to claim 1 further comprising a substrate-shielding structure, the substrate-shielding structure being installed in the deposition chamber, as being parallel to the substrate so as to partially protect the substrate from being exposed to the evaporated particles of oxide silicon and as having a gap of 3 mm or smaller between the substrate surface and the substrate-shielding structure in a direction perpendicular to a direction in which the substrates are transferred in the deposition chamber.

* * * * *